(12) United States Patent
Hsu

(10) Patent No.: US 7,095,143 B2
(45) Date of Patent: Aug. 22, 2006

(54) DEVICE AND METHOD FOR FERROFLUID POWER GENERATOR AND COOLING SYSTEM

(75) Inventor: Li-Chieh Hsu, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 418 days.

(21) Appl. No.: 10/388,629

(22) Filed: Mar. 17, 2003

(65) Prior Publication Data

US 2004/0182099 A1     Sep. 23, 2004

(51) Int. Cl.
*H02K 9/00*     (2006.01)

(52) U.S. Cl. ............... 310/52; 310/11; 310/54; 62/238.1; 62/259.2

(58) Field of Classification Search ........... 62/238.1, 62/259.2; 310/11, 52, 54
See application file for complete search history.

(56) References Cited

U.S. PATENT DOCUMENTS

| | | | | | |
|---|---|---|---|---|---|
| 4,064,409 | A | * | 12/1977 | Redman | 310/306 |
| 4,468,568 | A | * | 8/1984 | Carr et al. | 290/1 R |
| 6,628,017 | B1 | * | 9/2003 | Chass | 310/11 |
| 6,815,063 | B1 | * | 11/2004 | Mayes | 428/402 |
| 2002/0153781 | A1 | * | 10/2002 | Chass | 310/11 |

* cited by examiner

*Primary Examiner*—Cheryl Tyler
*Assistant Examiner*—B. Clayton McCraw
(74) *Attorney, Agent, or Firm*—Troxell Law Office, PLLC

(57) ABSTRACT

A device and method for ferrofluid power generator and cooling system, wherein the waste heat of electronic device is used as a heat source to vaporize fluid and form bubbles as a forwarding pump of the ferrofluid. The fluid with magnetic nano particles is pumped forward and rotated by a fluid mechanism, then passes through a high density coil to result in the time varying magnetic flux and induced current. No additional heat-dissipating device is needed for this invention to dispose the waste heat, which requires the waste heat to produce electricity, which provides cooling and saves power.

13 Claims, 6 Drawing Sheets

DEVICE AND METHOD FOR FERROFLUID POWER GENERATOR AND COOLING SYSTEM

BACKGROUND OF THE INVENTION

1. Field of the Invention

The invention relates to a device and method for ferrofluid power generator and cooling system, especially to a device and method applied to a ferrofluid power generator and cooling performed by the phase change of fluid that may remove waste heat generated from an electronic device.

2. Description of the Prior Art

Since IC was invented in 1959, IC fabrication technology has advanced tremendously. It is expected that an era of nano (nm) technology will come in the 21st century. Micro electronic devices have a huge impact on companies and systems because they added chip functions within a common space causing increased heat, which is a big challenge to the engineers and researchers. It is predictable that more functions embedded in a chip, require more cooling.

For either a personal computer or notebook, cooling is always an issue. Although cooling fans are already installed on a typical computer, they increase weight, consume extra power, and are not very effective. With the increased processing speed, the computer generates more waste heat. For a CPU (central processing unit) made by either INTEL or AMD, cooling must be done effectively, or the computer will become unstable, dead, or even burnt.

A notebook computer is convenient, light, and portable, consequently, it is preferably made as small and light as possible. Therefore, an interior of the notebook is always very limited. The most power-consuming component of a typical notebook is the central processing unit (CPU). The higher the processing speed, the more power consumed by CPU. Especially for a new generation Pentium 4 processor, much more power is consumed then Pentium 3 processor or Celeron model, therefore generating more heat.

Consequently, current manufacturers of electronic devices, especially for producers of notebook, are anxious to solve this heat-dissipating problem of the electronic component. As shown in FIG. 1, the traditional way to dissipate heat is to arrange a fan 11 and heat-dissipating fin 12 on a central processing unit (CPU) 10, such that CPU waste heat is conducted to the large area of heat-dissipating fin 12, then forced convection is performed by the fan 11.

Currently, for most notebooks, a CPU-attached fan (as shown in FIG. 1) and a system fan are installed, but for notebooks with Pentium 4 CPU, this method is not only power consuming (the consuming power ranges from 1.6 W to 7.7 W, the average is around 4.5 W) but also very noisy (the level of noise is around 39 dBA). Furthermore, the poor cooling efficiency of this type of cooling fan is far from perfect (cooling efficiency is only 0.1 $W/cm^2$) because of the limited heat-dissipation capacity of forced convection.

According to the shortcomings of aforementioned prior arts, the inventor proposes a device and method fo ferrofluid power generator and cooling system, such that the heat-dissipating problem of notebook may be resolved effectively, wherein the waste heat generated from the CPU may be applied as an energy source for power generating, such that the double effects of cooling and power saving of a notebook are achieved.

SUMMARY OF THE INVENTION

The invention is to provide a new concept of heat dissipation, wherein the waste heat of a CPU is conducted to a specific working fluid by a high efficiency heat absorbing system. The fluid is heated to its boiling point to generate bubbles, which are inflated and in turn drive the nano-magnetic particles mixed in the fluid to pass through a micro-coil with high spinning speed. Not only may this method remove the waste heat to increase the working efficiency of the system, but is also may reuse the waste heat to generate electric power.

The main object of the invention is to provide a device and method for ferrofluid power generator and cooling system, wherein an advanced cooling method of phase change and a power generating system driven by waste heat are proposed, such that the double effects of cooling and power saving are reaches. In addition, phase change cooling scheme is a much more effective heat dissipation method, no additional energy is needed, and no noise is generated.

Another objective of the invention is to provide a device for ferrofluid power generator and cooling, which can be applied to any heat generating electronic device. This system is comprised of a close loop pipe system and a coil. The pipe is connected to the electronic device, and filled with magnetized ferrofluid. The coil is wound around portion of the pipe. When the heat is conducted to the fluid and absorbed therein, part of the fluid is vaporized to generate bubbles to serve as forwarding pump, driving magnetized ferrofluid forward to pass through the coil, so that time varying magnetic flux is generated in the coil by spinning magnetic nano particles and then an induced current is produced.

According to the above concept, the pipe system is a closed loop. It is sequentially comprised of a vapor bubble pump, a vortex generator, a magnetic array, an induced magnetic field, etc.

According to the above concept, a vapor bubble pump is connected to the electronic device. When heat is conducted to the fluid to vaporize part of the fluid into bubbles, the bubbles are inflated and squeezed to drive the magnetic particles mixed in the fluid to pass through the coil. A check valve is arranged at both sides of the vapor bubble pump to confine the bubble in a chamber, and squeeze the fluid to move toward the induced magnetic field due to bubble expansion.

According to the above concept, a vortex generator rotates the magnetic particles to increase their spinning speed. The interior of the vortex generator has many surface cavities to generate vortex which results in the velocity variance around the particles, such that the magnetic particles are rotated.

According to the above concept, a magnetic array is constructed by arranging an array of magnetic field outside the pipe system, such that the phase angles of spinning magnetic particles may be aligned. Consequently, when the magnetic particles enter the induced magnetic field, the time varying magnetic flux is increased. The magnetic array is a permanent magnetic field, by which the magnetic direction of the magnetic particles is aligned and the cancellation magnetic moment among magnetic particles may be prevented.

According to the above concept, other passages may be arranged with a heat-dissipation device for further cooling. The heat-dissipation device is comprised of an array of horizontal fin-shape structure. The coil is wound around a section of the pipe outside of the induced magnetic field. The coil is made of copper in micrometer level.

According to the above concept, the ferrofluid is essentially a mixed fluid with magnetic particles, low boiling-point liquid, and water. The low boiling-point liquid is a non-electrolytic chemical coolant, such as: fluoride solution of FC-87, PF-5052, FC-72, or any combination of the above. The magnetic particle is a magnetized nano iron particle.

According to the above concept, the induced current is an alternate current (A.C.) with high frequency, so as rectifier may further be added to transform the A.C. into D.C. (direct current). If the electronic device is a CPU (central processing unit) installed in a notebook or nay other chip thereof, then the converted D.C. may be used to recharge the Lithium battery inside the notebook. The electronic device may be any kind of micro mechanical-electrical device.

Another objective of the invention is to provide a magnetic power generating method. It uses the waste heat from an electronic device wherein the heat is absorbed by a fluid, part of which is vaporized into bubbles to drive the fluid with magnetic particles to pass through a coil. After that, the magnetic ferrofluid generates a time varying magnetic flux and then induced the current.

BRIEF DESCRIPTION OF THE DRAWINGS

FIG. 5b is a cross-sectional illustration for the partial enlargement of FIG. 5a.

DETAILED DESCRIPTION OF THE PREFERRED EMBODIMENTS

The device for ferrofluid power generator and cooling system of the preferable embodiments according to the invention is described thereinafter, but its actual layout does not have to completely match the description of the system design. Those who are familiar with such technique may have variations or modifications within the spirit and scope of the invention.

Figure 1:
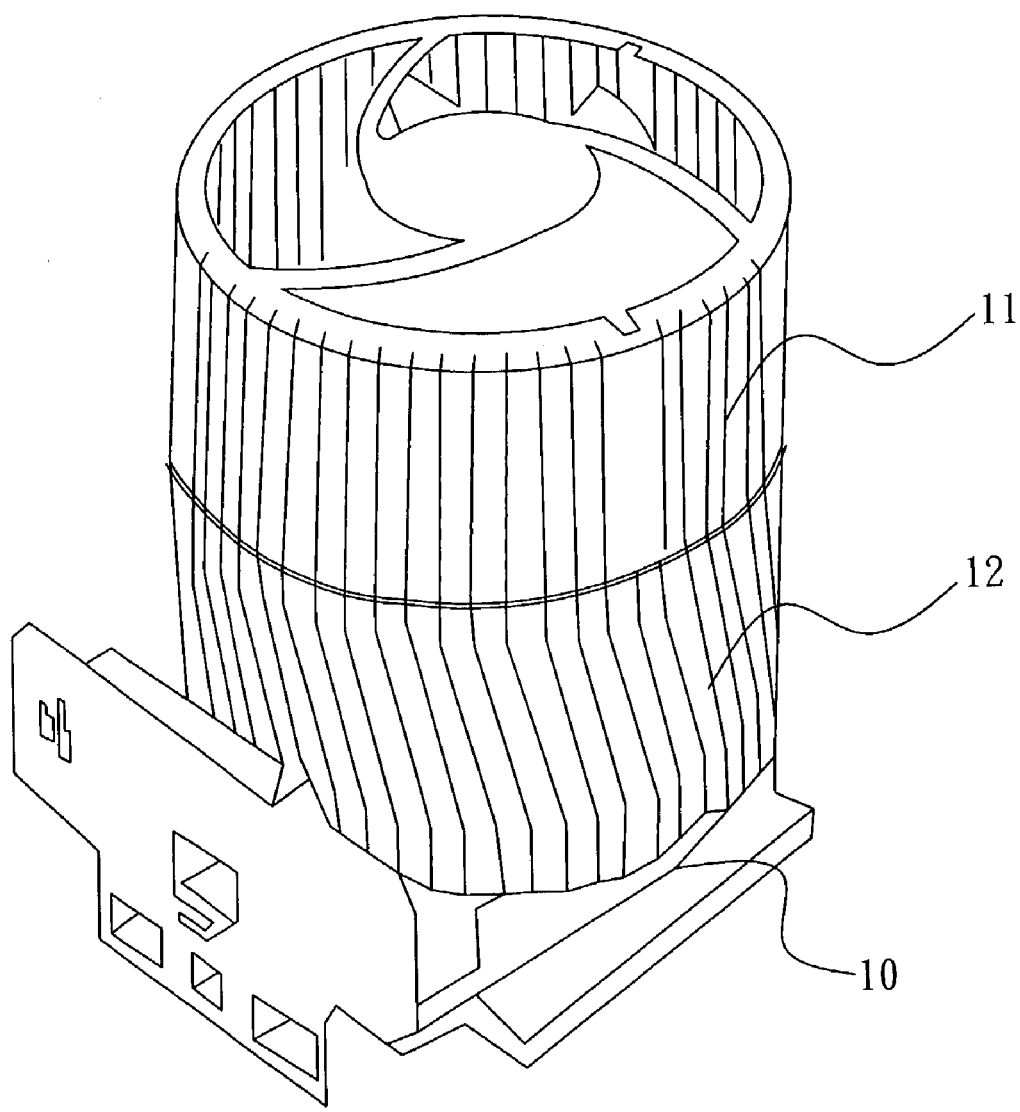
FIG. 1 is a heat-dissipating assembly for a computer CPU according to the prior arts.
Figure 2:
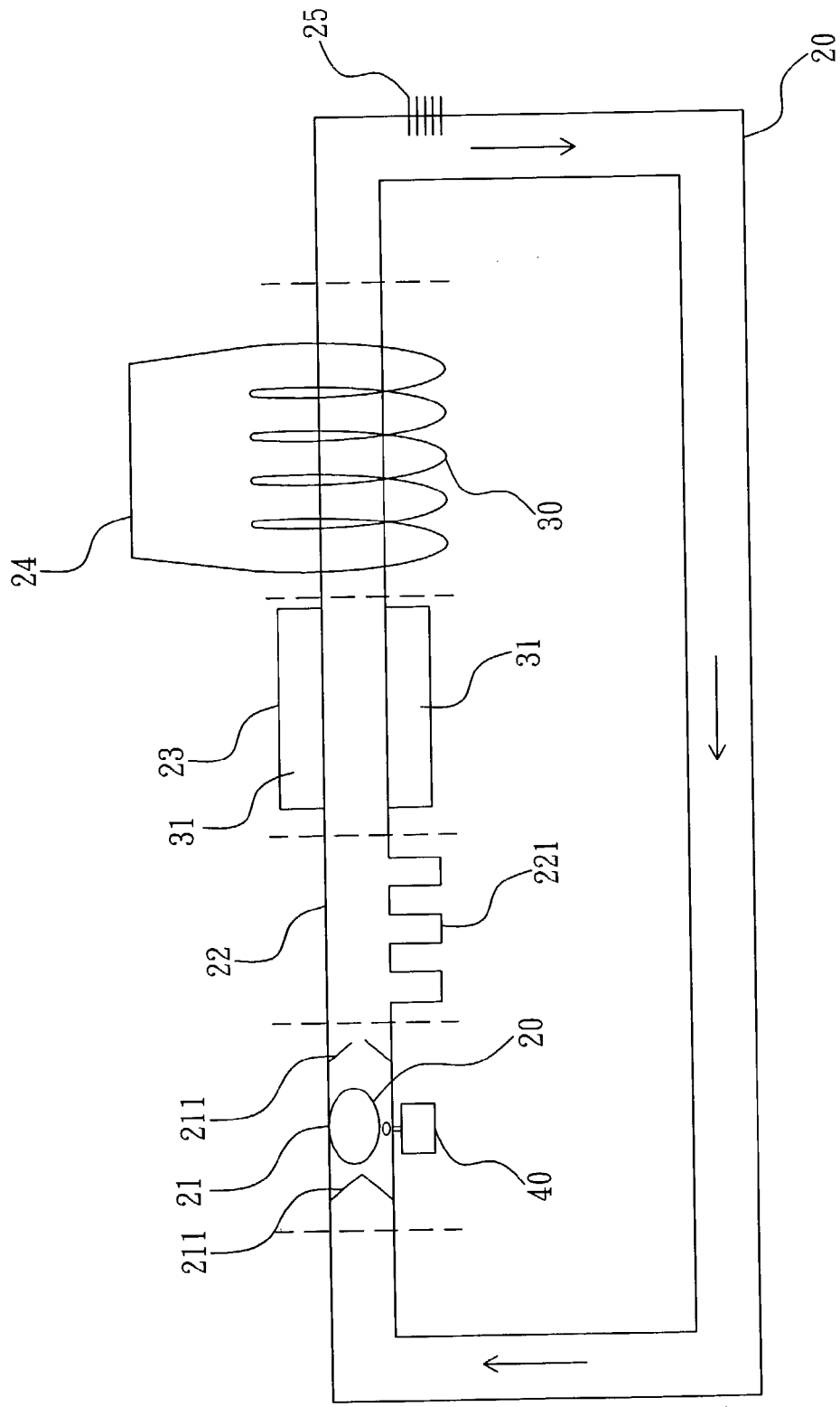
FIG. 2 is an illustration for the preferable basic layout of device for ferrofluid power generator and cooling system according to the present invention.

FIG. 2 is an illustration of the preferable basic layout of a device for ferrofluid power generator and cooling system according to the invention. THE invention includes a pipe system 20 and a coil 30. The pipe system 20 is connected to an electronic device 40 (a central processing unit abbreviated as CPU is taken as an example hereinafter) that generates waste heat. The coil 30 is wound around part of the pipe system 20 which is a closed loop filled with low boiling-point fluid (not shown in the drawings), and the magnetic particles (not shown in the drawings) are again contained in the fluid. When the heat is conducted to the fluid and is absorbed therein, part of the fluid is vaporized to generate bubbles 201 to reach the cooling effect and to drive the fluid to flow and push the magnetic particles to pass through the coil 30, therefore the time varying magnetic flux is generated in the coil 30 by the spinning magnetic particles and induced current is generated in the coil 30 as well.

A separate description of each part of the entire system is presented below. The pipe system 20 is sequentially comprised of a vapor bubble pump 21, a vortex generator 22, a magnetic array 23, an induced magnetic filed 24, and other passages, etc.

The vapor bubble pump 21 is directly connected to the CPU 40 (central processing unit). In this zone 21, when the heat of CPU 40 is conducted to the fluid to vaporize part of the fluid into bubbles 201, the bubbles 201 are inflated. A check valve 211 is arranged at each side of the vapor bubble pump 21 to confine the bubble in a chamber, then the fluid is squeezed to move toward the induced magnetic field 24 due to bubble expansion.

The interior of the vortex generator 22 has many surface cavities 221 to generate a vortex which results in the velocity variance around the particles, so that the magnetic particles pass through the coil 30 with a high spinning speed. The magnetic array 23 is constructed by arranging an array of magnetic fields 20 outside this section of pipe system, such that the phase angles of the spinning magnetic particles may be aligned and same phase angle rotation is generated. Consequently, when the magnetic nano particles enter the induced magnetic field 24, the time varying magnetic flux is increased. Moreover, the magnetic array 31 is a permanent magnetic field, by which the magnetic direction of the magnetic particles is aligned and the neutralization of magnetic fields among magnetic particles may be prevented.

The induced magnetic field 24 is where the pipe system 20 is wound by the coil 30. Another part may be installed with a heat-dissipating device 25 for further heat disposal. The heat-dissipation device 25 is preferably a heat-dissipating structure comprised of an array of horizontal fins.

The fluid essentially is a mixed liquid with magnetic particles, low boiling-point liquid, and water. The low boiling-point liquid is a non-electrolytic chemical coolant, such as: fluoride solution of FC-87, PF-5052, FC-72, or any combination of the above. The saturation temperature for chemical coolants are: 56.6° C., 32.0° C., and 50.0° C. respectively, which are much lower than that of pure water (100° C.). Therefore the vaporization frequency and bubble quantities are increased, and heat conduction is improved, and as a result from that, the heat is dissipated quickly. the magnetic particle is a magnetized nano iron particle. The coil 30 is made of copper in micrometer level which helps the spinning magnetic nano iron particles to generate time varying magnetic flux.

Figure 3:
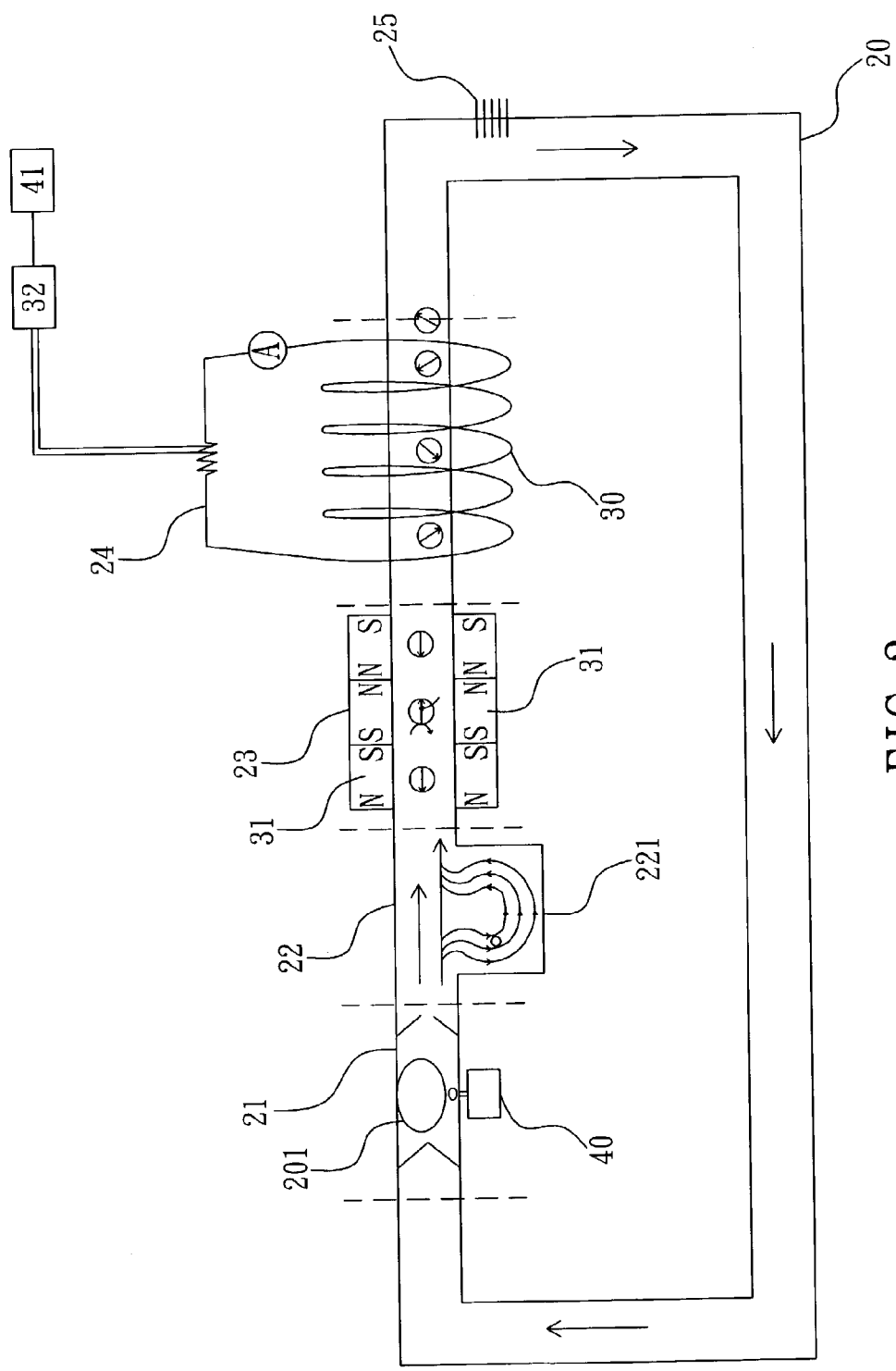
FIG. 3 is a design framework view of a power generating system of the device for ferrofluid power generator and cooling system according to one preferable embodiment of the present invention.

FIG. 3 is a design framework view of a power generator system of the device for ferrofluid power generator and cooling system according to one preferable embodiment of the invention. Similar to FIG. 2, the basic concept of power generation is: the fluid of the vapor bubble pump 21 absorbs the heat from central precessing unit (CPU) 40 to generate bubbles 201, which in turn drive the magnetic particles to move forward; while fluid passes through vortex generator section 22, the vortex is generated in the cavities 221 inside of the vortex generator section 22, and the magnetic particles spin in cavities 221 because of different velocity surround the particles. Finally, the magnetic particles enter the magnetic array 23 to have their magnetic directions aligned by the permanent magnetic field 31, it therefore prevents the cancellation of the magnetic moment among magnetic particles. Consequently, the time varying magnetic flux in the induced magnetic field 24 is increased, and the maximum induced current is generated. The remaining waste heat of the entire power generator system is disposed by the heat-dissipating device 25. The resulting induced current A is a high-frequency alternate current (A.C.), a rectifier 32 may be added to transform the alternate current (A.C.) into direct current (D.C.). If the electronic device 40 is a CPU (central precessing unit) in a notebook or any other chip thereof, then the transformed D.C. may be used to recharge a Lithium battery 41 of the notebook.

Figure 4:
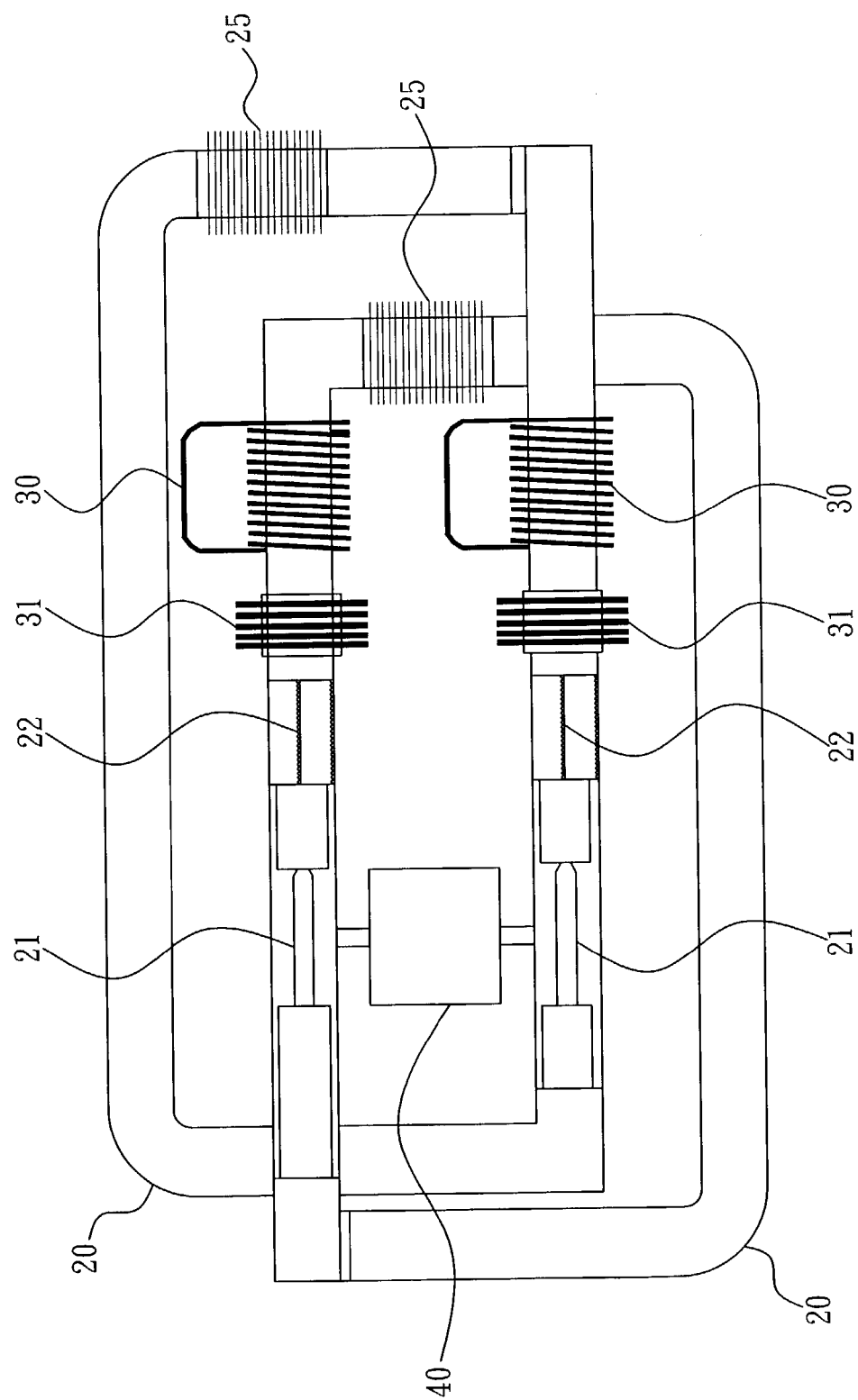
FIG. 4. is a structural illustration for the entire device for ferrofluid power generator and cooling system according to one preferable embodiment of the present invention.
Figure 5A:
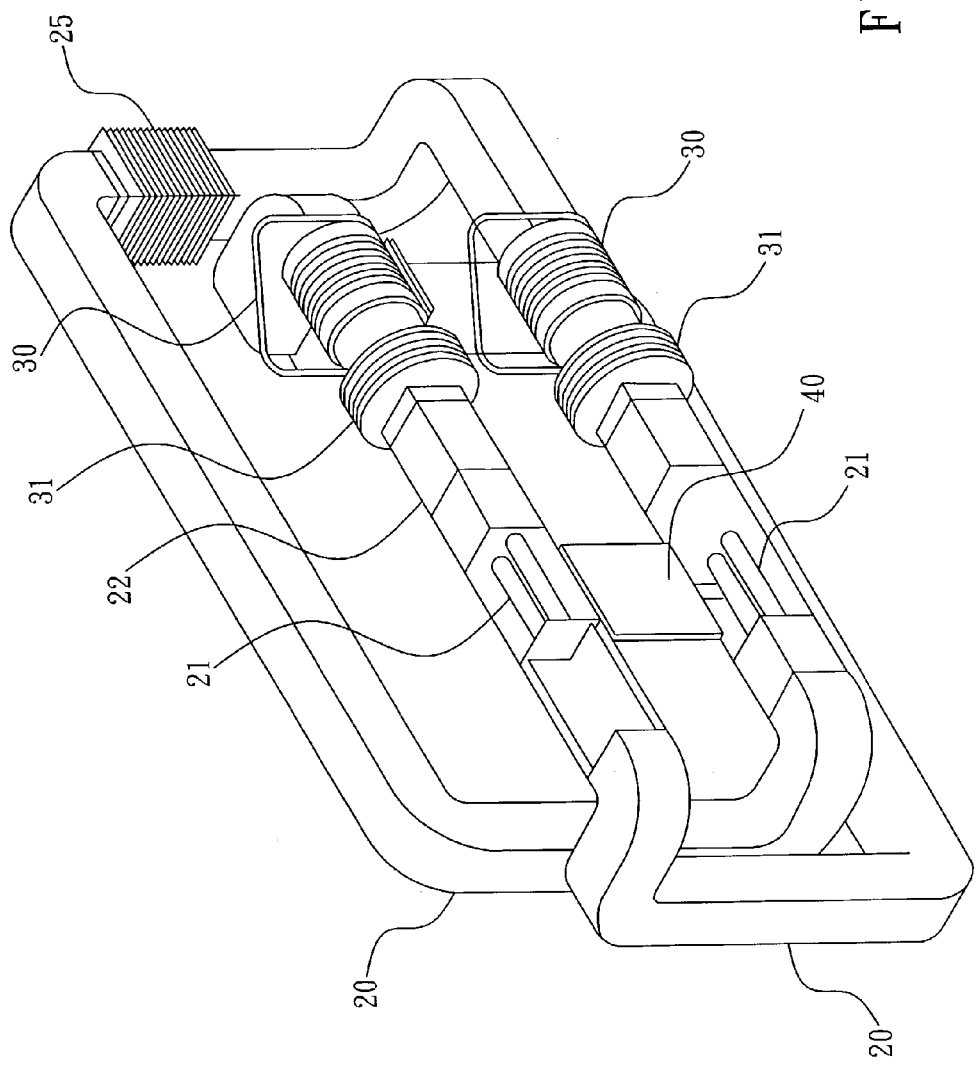
FIG. 5a is a 3-D illustration of FIG. 4.
Figure 5B:
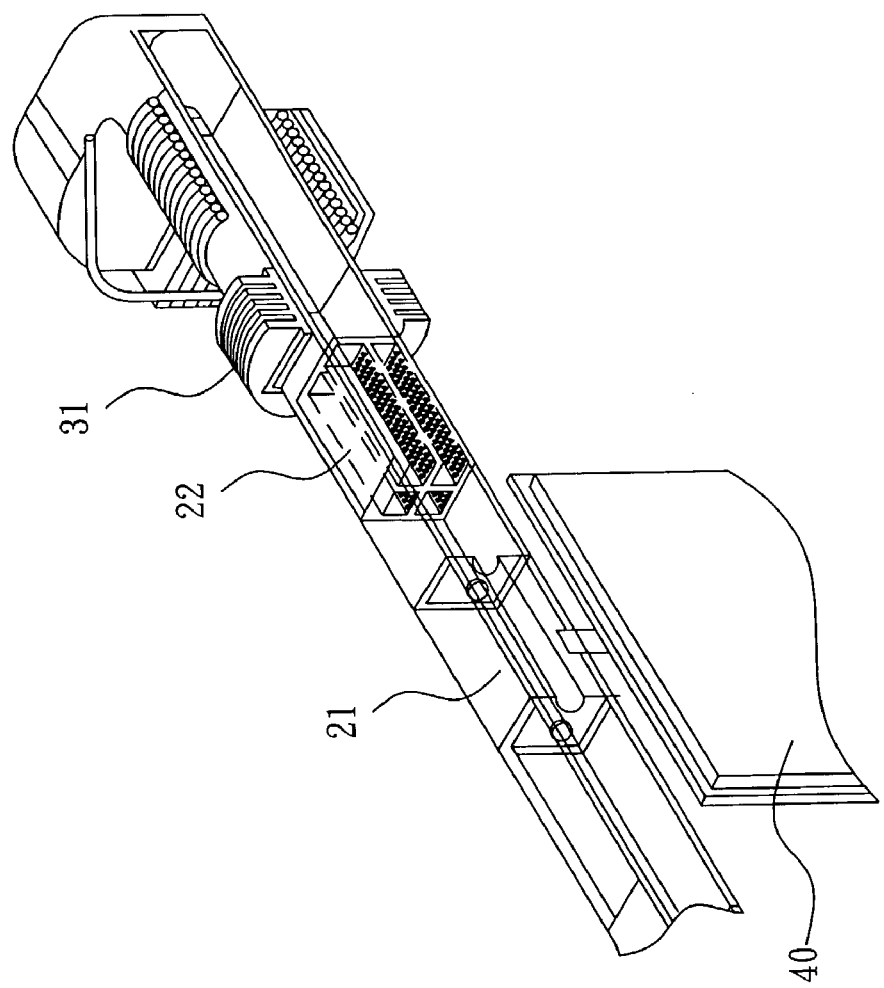

FIG. 4 is a structural illustration for the entire device for ferrofluid power generator and cooling system according to one preferable embodiment of the invention. FIG. 5a is a 3-D illustration of FIG. 4. FIG. 5b is a cross-section illustration for the partial enlargement of FIG. 5a, showing the vapor bubble pump 21, the vortex generator 22, and the magnetic array 31. The difference between this embodiment and those in FIG. 2 and FIG. 3 is that: the CPU 30 (central processing unit) is contacted with the ferrofluid power generator and cooling device according to the invention, so that the CPU 40 waste heat may be more effectively utilized and disposed.

The actual implementation utilizes a Pentium 4 notebook as an example. Typically, the heat generated from a Pentium 4 CPU of a notebook is about 35 W. Its surface temperature is about 70° C. to 85° C., its efficiency is estimated by computation. When the low boiling-point fluid described by the invention absorbs the CPU waste heat and results in phase change, the CPU is cooled and the fluid is vaporized to bubbles. This procedure of boiling and vaporizing of the fluid caused by the heat absorption maybe calculated by Rohsenow's nucleate pool boiling relation as follows:

$$\frac{C_l \cdot \Delta T_x}{h_{fg} \cdot P_r^s} = C_{sf} \left[ \frac{q/A}{\mu_l \cdot h_{fg}} \sqrt{\frac{g_c}{g(\rho_l - \rho_v)}} \right]^{0.33}$$

And the power generating efficiency ($\eta$) is: $\eta = P/Q$

Where, P is the generated power and Q is the thermal energy.

For combined effect of phase change cooling and the ferrofluid power generating from waste heat, the heat dissipated is about 36 W, the power generating efficiency is estimated as 10.7%, the generated power is around 3.5 W. Therefore the estimated power saving for the entire system is about 17.86% of electric power consumed. Since a Lithium battery of the notebook can only provide power for 1.5–2.5 hours, saving power will prolong the battery's time or reduce it size.

In summary, the invention indeed provides a device and method for ferrofluid power generating and cooling. It is no longer necessary to use traditional power consuming fan, additional mechanism, or extra energy for cooling and heat dissipating. In this invention, an advanced electronic cooling scheme of phase change and an power generator system using waste heat an energy source are combined together to reach the effects of cooling and power saving. In addition, heat-dissipation by phase change may greatly improve the heat dissipation efficiency without consuming extra energy or generating any noise. The principle of the invention is to use low boiling-point magnetic nano ferrofluid. When the fluid absorbs heat and results in its phase change, the vaporized bubbles drive fluid with its magnetic particles forward and pass through the micro-coil to generate electric power. The invention therefore may be further applied to any heat-generating chip set or micro mechanical-electric device or auxiliary power generating equipment which utilizes thermal energy.

The invention claimed is:

1. A device for ferrofluid power generator and cooling system applied in an electronic device that generates heat comprising:
   a pipe system connected to the electronic device by direct contact, and the pipe system contains fluid mixed with magnetic particles; and
   a coil wound around one part of the pipe system wherein when the heat is conducted to the fluid and is absorbed therein, a part of the fluid is vaporized to generate bubbles for cooling and the fluid is pumped forward and the magnetic particles are pushed through a coil, the magnetic particles cause time varying magnetic flux inside the coil producing induced current in the coil,
   wherein the pipe system is sequentially comprised of a vapor bubble pump, a vortex generator, a magnetic array, and an induced magnetic field, and other passages.

2. The device for ferrofluid power generator and cooling system according to claim 1, wherein the vapor bubble pump has direct contact with the electronic device and, when heat is conducted to the fluid to vaporize part of the fluid into bubbles, the bubbles are inflated and squeezed to drive the magnetic particles mixed in the fluid to pass through the coil.

3. The device for ferrofluid power generator and cooling system according to claim 2, wherein a check valve is installed at each end of the vapor bubble pump to control the bubbles to progress in desired direction, so that the fluid is squeezed to move toward the induced magnetic field.

4. The device for ferrofluid power generator and cooling system according to claim 1, wherein the vortex generator is applied to generate vortexes for the magnetic particles to increase their spinning speed when they pass through the coil.

5. The device for ferrofluid power generator and cooling system according to claim 4, wherein the interior of the vortex generator has many surface cavities to generate vortexes to the fluid, which result in the spinning magnetic particles.

6. The device for ferrofluid power generator and cooling system according to claim 1, wherein the magnetic array is installed by arranging an array of magnetic field outside this section of pipe system, so that the phase angles of the spinning magnetic particles may be aligned and a same phase angle rotation is achieved; consequently, when the magnetic particles enter the induced magnetic field, the time varying magnetic flux is increased.

7. The device for ferrofluid power generator and cooling system according to claim 6, wherein the magnetic array is a permanent magnetic field, by which the magnetic direction of the magnetic particles is aligned that the neutralization among the magnetic fields of magnetic particles may be prevented.

8. The device for ferrofluid power generator and cooling system according to claim 1, wherein the coil is wound around a portion of the pipe system where the induced magnetic field is located.

9. A device for ferrofluid power generator and cooling system applied in an electronic device that generates heat comprising:
   a pipe system connected to the electronic device by direct contact, and the pipe system contains fluid mixed with magnetic particles; and
   a coil wound around one part of the pipe system wherein when the heat is conducted to the fluid and is absorbed therein, a part of the fluid is vaporized to generate bubbles for cooling and the fluid is pumped forward and the magnetic particles are pushed through a coil, the magnetic particles cause time varying magnetic flux inside the coil producing induced current in the coil, wherein the fluid is a mixed solution with low boiling-point liquid, and wherein the low boiling-point liquid is a non-electrolytic chemical coolant.

10. The device for ferrofluid power generator and cooling system according to claim 9, wherein the non-electrolytic chemical coolant is a fluoride solution.

11. The device for ferrofluid power generator and cooling system according to claim 10, wherein the fluoride solution is a solution selected from FC-87, PF-5052, FC-72, or any combination thereof.

12. The device for ferrofluid power generator and cooling system according to claim 11, wherein the mixed solution further contains water.

13. A method for ferrofluid power generating and cooling is applied in a heat generating electronic device, this method is comprised of the following steps:

providing a close loop pipe system, which is connected to the electronic device with direct contact, and which has a fluid containing magnetic particles; and providing a coil, which is wound around portion of the pipe system wherein, when the heat is conducted to the fluid and is absorbed therein, part of the fluid is vaporized to generate bubbles to reach the cooling effect, and the bubbles pump the fluid forward and push the magnetic particles to pass through the coil, such that a time varying magnetic flux is generated in the coil by the magnetic particles and an induced current is generated by the coil as well, and further comprising a step of:

providing a rectifier, which is used to transform the induced current into a direct current (D.C.) to recharge the electronic device.

* * * * *